US012772477B2

(12) United States Patent
Jang et al.

(10) Patent No.: US 12,772,477 B2
(45) Date of Patent: Oct. 20, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Shu-Uei Jang, Hsinchu (TW); Shih-Yao Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 447 days.

(21) Appl. No.: 18/512,593

(22) Filed: Nov. 17, 2023

(65) Prior Publication Data

US 2025/0169090 A1 May 22, 2025

(51) Int. Cl.

| | |
|---|---|
| ***H10D 30/01*** | (2025.01) |
| ***H10D 30/43*** | (2025.01) |
| ***H10D 30/62*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |

(Continued)

(52) U.S. Cl.

CPC ......... *H10D 30/024* (2025.01); *H10D 30/014* (2025.01); *H10D 30/43* (2025.01); *H10D 30/6211* (2025.01); *H10D 30/6735* (2025.01); *H10D 30/6757* (2025.01); *H10D 62/121* (2025.01); *H10D 64/017* (2025.01); *H10D 84/017* (2025.01); *H10D 84/0193* (2025.01); *H10D 84/038* (2025.01); *H10D 84/853* (2025.01); *H10W 20/033* (2026.01)

(58) Field of Classification Search

None

See application file for complete search history.

(56) References Cited

U.S. PATENT DOCUMENTS

| | | | | |
|---|---|---|---|---|
| 11,923,363 | B2 * | 3/2024 | Frougier | H10D 30/014 |
| 2019/0074362 | A1 | 3/2019 | Lee et al. | |
| 2021/0098304 | A1 * | 4/2021 | Chang | H10D 30/014 |

(Continued)

FOREIGN PATENT DOCUMENTS

TW 202135230 A 9/2021

*Primary Examiner* — Michelle Mandala

(74) *Attorney, Agent, or Firm* — Ingrassia Fisher & Lorenz, LLP | IF&L

(57) ABSTRACT

A semiconductor fabrication method includes: providing a separating wall and a plurality of liners including a first liner and a second liner between a first fin and a second fin having an epitaxial stack and a sacrificial gate stack over channel regions of the second fin; recessing a sacrificial epitaxial layer of the epitaxial stack to form a cavity; recessing the first line thereby expanding the cavity; recessing the second liner thereby expanding the cavity; forming inner spacer material in the first and second cavities; forming source/drain features; and replacing the sacrificial epitaxial layer and the sacrificial gate stack with a metal gate layer; wherein the metal gate layer has a first critical dimension (CD) measured between the inner spacer material, and wherein the first liner after recessing has a second CD measured between the inner spacer material that is approximately equal to the first CD.

20 Claims, 15 Drawing Sheets

(51) Int. Cl.
*H10D 84/85* (2025.01)
*H10W 20/00* (2026.01)

(56) References Cited

U.S. PATENT DOCUMENTS

| | | | | |
|---|---|---|---|---|
| 2022/0149178 | A1 | 5/2022 | Peng et al. | |
| 2022/0246759 | A1 | 8/2022 | Mehandru et al. | |
| 2023/0268344 | A1* | 8/2023 | Huang | H10D 30/014 257/288 |
| 2024/0371873 | A1* | 11/2024 | Chen | H10D 30/6735 |

* cited by examiner

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
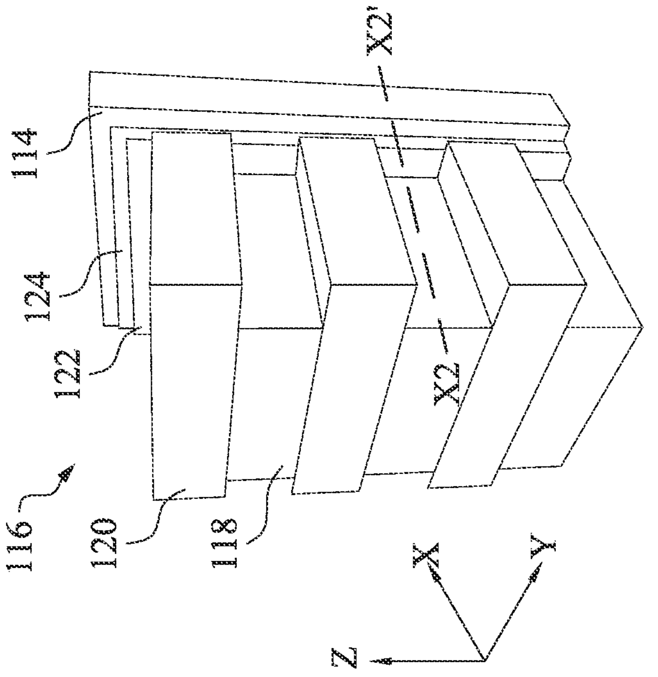
FIG. 1B shows a perspective view of a portion of the semiconductor device of FIG. 1A corresponding to lines X1-X1' at one of various stages of a sequential semiconductor device manufacturing process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. Various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies and may be incorporated into a variety of semiconductor devices and products. Further, it is noted that semiconductor device structures include a varying number of components and that single components shown in the illustrations may be representative of multiple components.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer, or section. Thus, a first element, component, region, layer, portion, or section discussed below could be termed a second element, component, region, layer, portion, or section without departing from the teachings of the present disclosure.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

In certain embodiments herein, a "material layer" is a layer that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a layer that is a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of an aluminum layer and a layer of aluminum is a layer that is at least 50 wt. %, at least 60 wt. %, at least 75 wt. %, at least 90 wt. %, at least 95 wt. %, or at least 99 wt. % of aluminum.

It is to be understood that the phraseology or terminology herein is for the purpose of description and not of limitation, such that the terminology or phraseology of the present specification is to be interpreted by those skilled in relevant art(s) in light of the teachings herein.

The following disclosure provides many different embodiments, or examples, for implementing different features of the disclosed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As used herein, a "layer" is a region, such as an area comprising arbitrary boundaries, and does not necessarily comprise a uniform thickness. For example, a layer can be a region comprising at least some variation in thickness.

The present disclosure is generally related to semiconductor devices and the fabrication thereof, and more particularly to multi-gate devices. Multi-gate devices include those transistors whose gate structures are formed on at least two-sides of a channel region. These multi-gate devices may include an n-type metal-oxide-semiconductor device or a p-type metal-oxide-semiconductor multi-gate device. Specific examples herein may be presented and referred to herein as a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or another suitable channel configuration. Presented herein are embodiments of devices that may have one or more channel regions (e.g., nanosheets) associated with a single, contiguous gate structure. However, one of ordinary skill would recognize that the teaching can apply to a single channel or any number of channels, such as a FinFET device, on account of its fin-like structure. One of ordinary skill may recognize other examples of semiconductor devices that may benefit from aspects of the present disclosure.

The gate-all-around (GAA) silicon nanosheet structures have been recognized as excellent candidates to achieve improved power performance and area scaling compared to other FinFET technologies. Specifically, GAA structures provide high drive currents due to wide effective channel width while maintaining short-channel control.

Figure 1A:
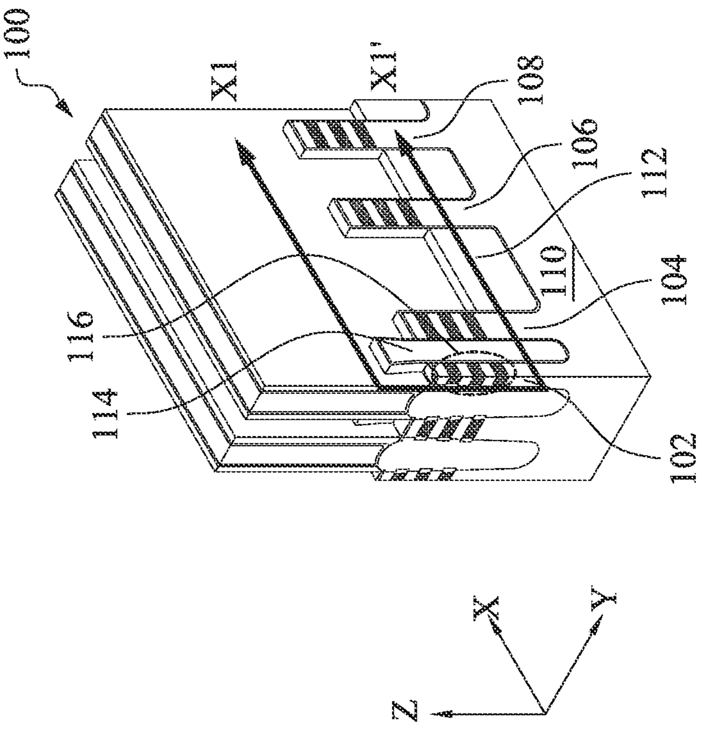
FIG. 1A shows a perspective view of a semiconductor device, in accordance with some embodiments.
Figure 1D:
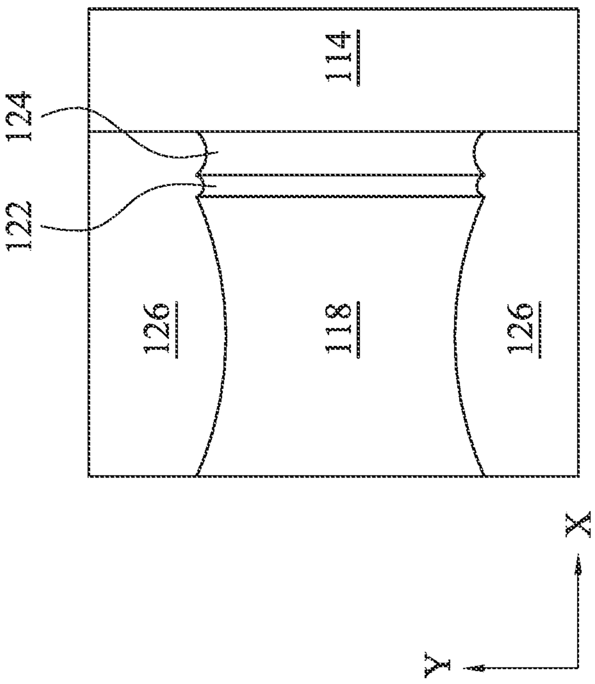
FIG. 1D shows a cross sectional view corresponding to line X2-X2' of FIG. 1B at another of various stages of a sequential semiconductor device manufacturing process, in accordance with some embodiments.
Figure 1C:
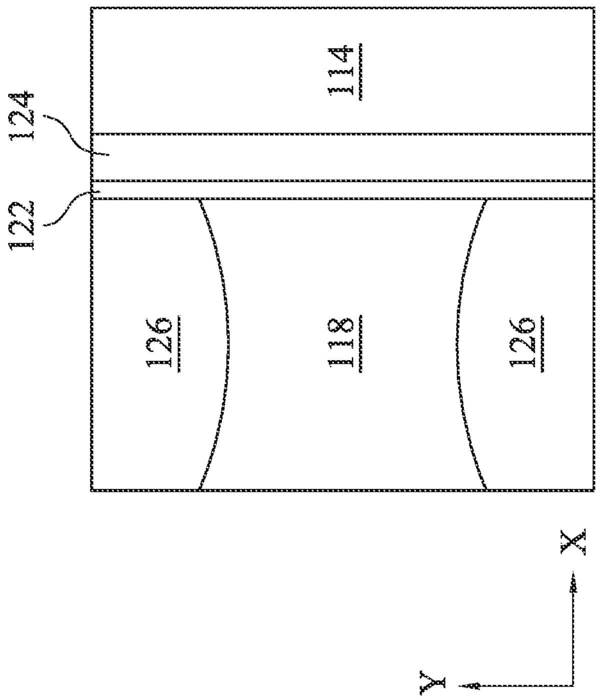
FIG. 1C shows a cross sectional view corresponding to line X2-X2' of FIG. 1B at another of various stages of a sequential semiconductor device manufacturing process, in accordance with some embodiments.

FIGS. 1A-1D show various views of a GAA semiconductor device according to some embodiments of the present disclosure. FIG. 1A shows a perspective view of a semiconductor device according to some embodiments of the present disclosure. FIG. 1B shows a perspective view of a portion of the semiconductor device of FIG. 1A corresponding to lines X1-X1' at one of various stages of a sequential semiconductor device manufacturing process according to some embodiments of the present disclosure. FIG. 1C shows a cross sectional view corresponding to line X2-X2' of FIG. 1B at another of various stages of a sequential semiconductor device manufacturing process according to some embodiments of the present disclosure. FIG. 1D shows a cross sectional view corresponding to line X2-X2' of FIG. 1B at another of various stages of a sequential semiconductor device manufacturing process according to some embodiments of the present disclosure.

FIG. 1A shows a portion of a semiconductor device 100 that includes multiple fins 102, 104, 106, and 108 on a substrate 110. Fins 104, 106, and 108 are separated from each other via isolation structures such as shallow trench isolation (STI) 112. Fins 102 and 104 are separated from each other via isolation structures such as a dielectric separating wall 114. Each fin in the example of FIG. 1A includes an epitaxial stack region 116 that includes alternating epitaxial layers.

As shown in FIG. 1B, the alternating epitaxial layers of epitaxial stack region 116 include sacrificial epitaxial layers 118 of a first composition interposed by channel epitaxial layers 120 of a second composition. The first and second composition can be different. The epitaxial stack region 116 is separated from the dielectric separating wall 114 by a plurality of liners (e.g., first liner 122 and second liner 124).

As shown in FIG. 1C, the sacrificial epitaxial layers 118 are recessed forming a cavity 126 around the sacrificial epitaxial layers 118. The first liner 122, however, may provide a current leakage path between a metal gate layer that later replaces the sacrificial epitaxial layers 118 and a subsequently formed source/drain region that is later formed opposite the cavity 126. In this disclosure, a source and a drain are interchangeably used, and the structures thereof are substantially the same.

As shown in FIG. 1D, to prevent a current leakage path between a subsequently formed metal gate layer and a subsequently formed source/drain region, the liners (e.g., first liner 122 and second liner 124) are also recessed to extend the cavity 126 to the dielectric separating wall 114. Inner spacer material subsequently formed in the cavity 126 can prevent a current leakage path between a subsequently formed metal gate layer and a subsequently formed source/drain region.

Figure 2:
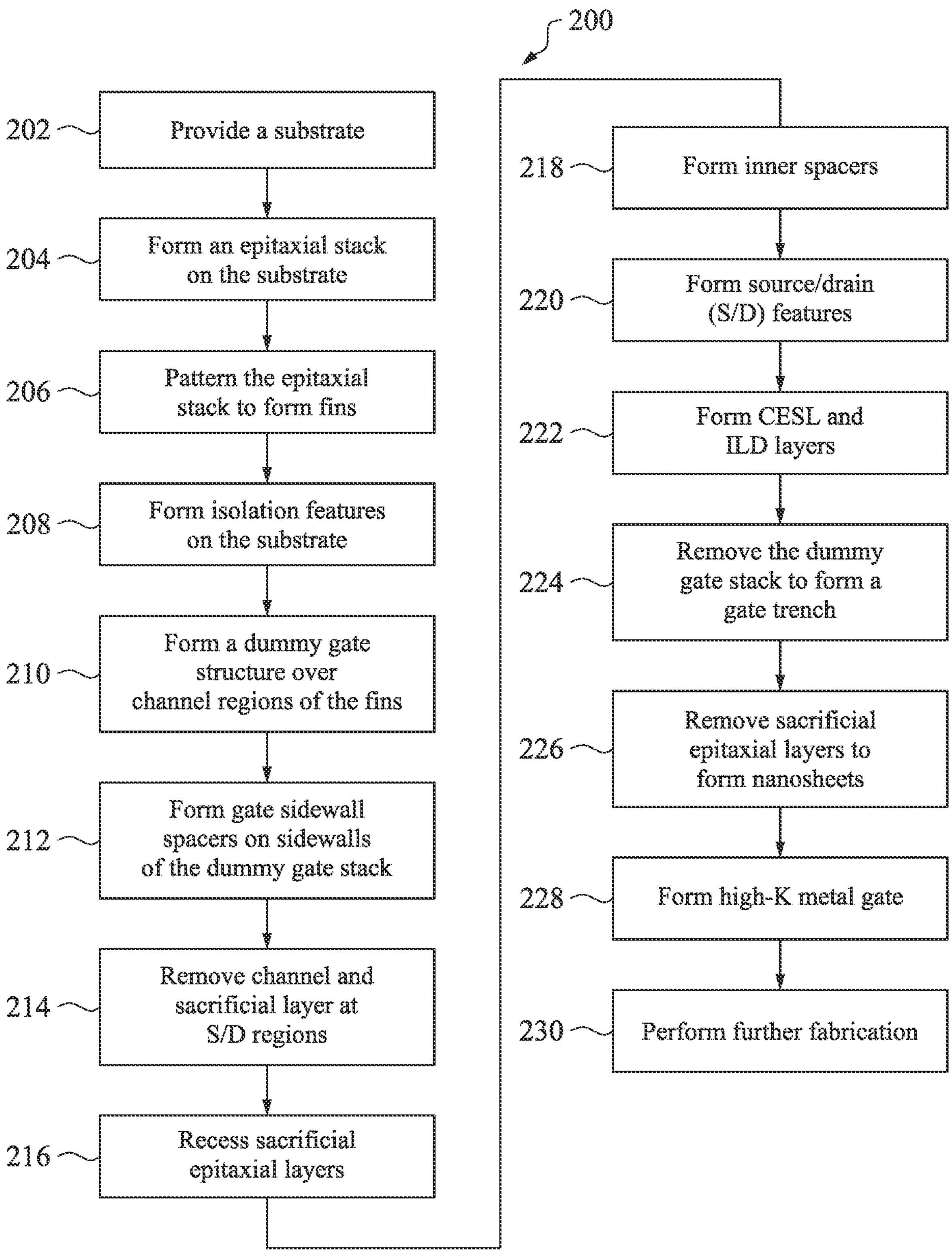
FIG. 2 is a flow chart depicting an example method of semiconductor fabrication including fabrication of multi-gate devices, in accordance with some embodiments.

FIG. 2 is a flow chart depicting an example method 200 of semiconductor fabrication including fabrication of multi-gate devices that includes recessing liner layers disposed between a sacrificial epitaxial layer and a dielectric separating wall, according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nano structure" or "nanosheet," which is used herein to designate any material portion with nanoscale, or even microscale dimensions, and having an elongate shape, regardless of the cross-sectional shape of this portion. Thus, the term "nanostructure" or "nanosheet" as used herein designates both circular and substantially circular cross-section elongate material portions, and beam or bar-shaped material portions including for example a cylindrical in shape or substantially rectangular cross-section.

FIG. 2 is described in conjunction with FIGS. 3A-3L, which illustrate a semiconductor device 300 or structure at various stages of fabrication in accordance with some embodiments. The method 200 is merely an example and is not intended to limit the present disclosure beyond what is explicitly recited in the claims. Additional steps may be provided before, during, and after method 200, and some of the steps described can be moved, replaced, or eliminated for additional embodiments of method 200. Additional features may be added in the semiconductor device 300 depicted in the figures, and some of the features described below can be replaced, modified, or eliminated in other embodiments.

As with the other method embodiments and exemplary devices discussed herein, it is understood that parts of the semiconductor devices may be fabricated by semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and/or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 200, include any descriptions given with reference to the figures, as with the remainder of the method and exemplary figures provided in this disclosure, are merely exemplary and are not intended to be limiting beyond what is specifically recited in the claims that follow.

FIGS. 3A-3L are cross-sectional side views of an embodiment of the example semiconductor device 300 at various stages of fabrication in an example fabrication process in accordance with some embodiments. In some figures, some reference numbers of components or features illustrated therein may be omitted to avoid obscuring other components or features; this is for ease of depicting the figures.

At block 202, the example method 200 includes providing a substrate. Referring to the example of FIG. 3A, in an embodiment of block 202, a substrate 302 is provided for forming a multi-gate device 300. In some embodiments, the substrate 302 may be a semiconductor substrate such as a silicon (Si) substrate. In some embodiments, the substrate 302 includes a single crystalline semiconductor layer on at least its surface portion. The substrate 302 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 302 may include a compound semiconductor and/or an alloy semiconductor. The substrate 302 may include various layers, including conductive or insulating layers formed on a semiconductor substrate. The substrate 302 may include various doping configurations depending on design requirements. For example, different doping profiles (e.g., n wells, p wells) may be formed on the substrate 302 in regions designed for different device types (e.g., n-type field effect transistors (NFET), p-type field effect transistors (PFET)). The suitable doping may include ion implantation of dopants and/or diffusion processes. The substrate 302 has isolation features (e.g., shallow trench isolation (STI) features) interposing the regions providing different device types. Further, the substrate 302 may be strained for performance enhancement, may include a silicon-on-insulator (SOI) structure, and/or have other suitable enhancement features.

Figure 3A:
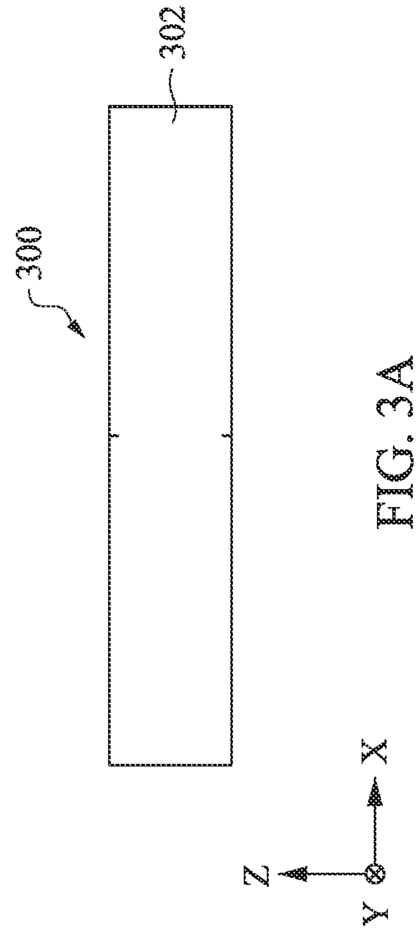
FIGS. 3A-3L are cross-sectional side views of an embodiment of an example semiconductor device at various stages of fabrication in an example fabrication process in accordance with some embodiments.
Figure 3B:
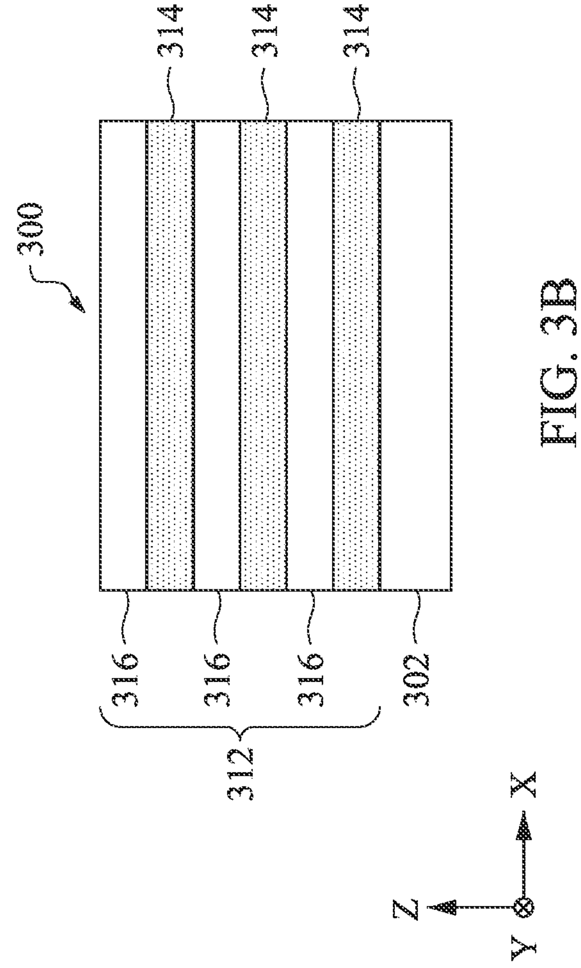
Figure 3D:
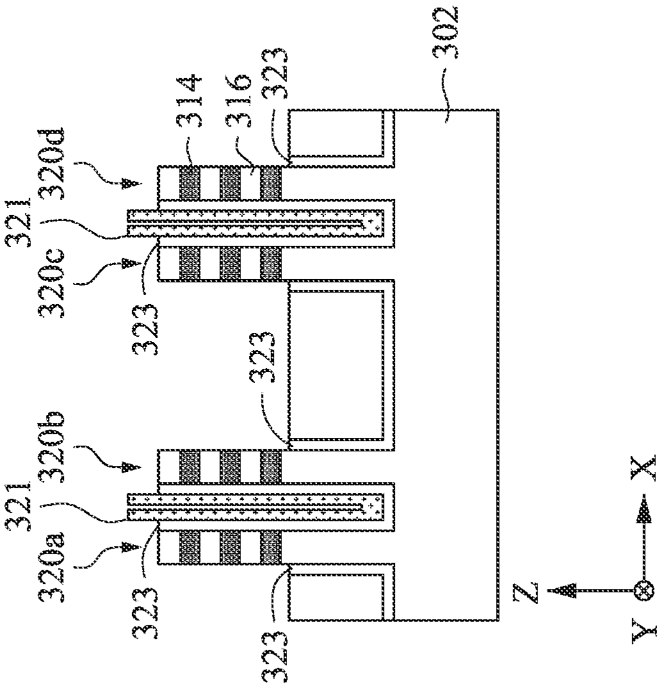
Figure 3C:
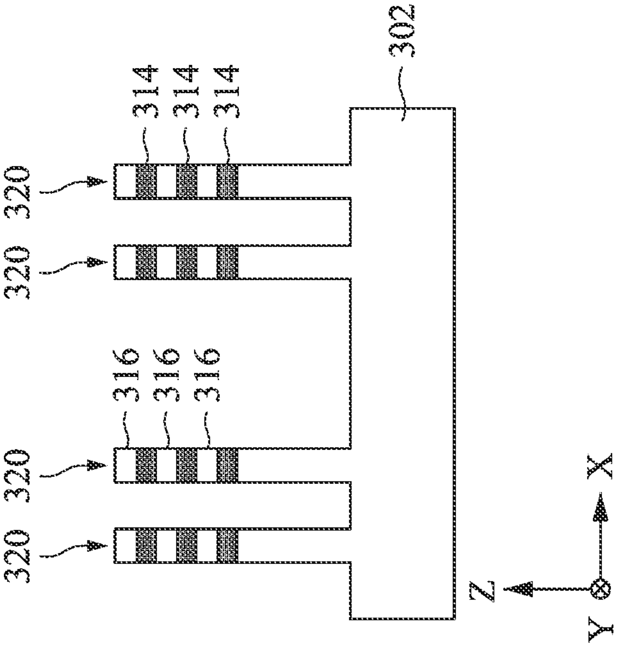

At block 204, the example method 200 then includes forming an epitaxial stack that includes one or more epitaxial layers over the substrate. Referring to the example of FIG. 3B, in an embodiment of block 204, an epitaxial stack 312 is formed over the substrate 302. The epitaxial stack 312 includes sacrificial epitaxial layers 314 of a first composition interposed by channel epitaxial layers 316 of a second composition. The first and second composition can be different. In an embodiment, the sacrificial epitaxial layers 314 are formed from SiGe and the channel epitaxial layers 316 are formed from silicon (Si). However, other embodiments are possible including those that provide for a first composition and a second composition having different oxidation rates and/or etch selectivity. In some embodiments, the sacrificial epitaxial layer 314 includes SiGe and the channel epitaxial layer 316 includes silicon (Si). However, other embodiments are possible including those that provide for a first composition and a second composition having different oxidation rates and/or etch selectivity. In some embodiments, the sacrificial epitaxial layer 314 includes SiGe and where the channel epitaxial layer 316 includes Si, the Si oxidation rate of the channel epitaxial layer 316 is less than the SiGe oxidation rate of the sacrificial epitaxial layer 314. It is noted that three (3) layers each of sacrificial epitaxial layers 314 and channel epitaxial layers 316 are illustrated in FIG. 3B, which is for illustrative purposes only and not intended to be limiting beyond what is specifically recited in the claims. In various embodiments, any number of epitaxial layers can be formed in the epitaxial stack 312; the number of layers depending on the desired number of channel regions for the device 300. In some embodiments, the number of channel epitaxial layers 316 is between 2 and 10, such as 3, 4 or 5.

In some embodiments, the sacrificial epitaxial layer 314 has a thickness ranging from about 4 nm to about 12 nm. The sacrificial epitaxial layers 314 may be substantially uniform in thickness. In some embodiments, the channel epitaxial layer 316 has a thickness ranging from about 3 nm to about 6 nm. In some embodiments, the channel epitaxial layers 316 of the stack are substantially uniform in thickness.

As described in more detail below, the channel epitaxial layer 316 may serve as channel region(s) for a subsequently formed multi-gate device and its thickness is chosen based on device performance considerations. The sacrificial epitaxial layer 314 may serve to reserve a spacing (or referred to as a gap) between adjacent channel region(s) for a subsequently formed multi-gate device and its thickness is chosen based on device performance considerations.

By way of example, epitaxial growth of the epitaxial stack 312 may be performed by a molecular beam epitaxy (MBE) process, a metalorganic chemical vapor deposition (MOCVD) process, and/or other suitable epitaxial growth processes. In some embodiments, the epitaxially grown layers, such as the channel epitaxial layer 316, include the same material as the substrate 302, such as silicon (Si). In some embodiments, the epitaxially grown sacrificial epitaxial layers 314 and channel epitaxial layers 316 include a different material than the substrate 302. As stated above, in at least some examples, the sacrificial epitaxial layer 314 includes an epitaxially grown $Si_{1-x}Ge_x$ layer (e.g., x is about 25~55%) and the channel epitaxial layer 316 includes an epitaxially grown Si layer. Alternatively, in some embodiments, either of the sacrificial epitaxial layers 314 or channel epitaxial layers 316 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the sacrificial epitaxial layers 314 and channel epitaxial layers 316 may be chosen based on providing differing oxidation and etch selectivity properties. In various embodiments, the sacrificial epitaxial layers 314 and channel epitaxial layers 316 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

At block 206, the example method 200 includes patterning the epitaxial stack to form semiconductor fins (also referred to as fins). Referring to the example of FIG. 3C, in an embodiment of block 206, a plurality of fins 320 extending from the substrate 302 are formed. In various embodiments, each of the fins 320 includes an upper portion of the interleaved sacrificial epitaxial layers 314 and channel epitaxial layers 316 and a bottom portion protruding from the substrate 302.

The fins 320 may be fabricated using suitable processes including photolithography and etch processes. The photolithography process may include forming a photoresist layer over the substrate 302 (e.g., over the epitaxial stack 312), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 302, and epitaxial stack 312 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

At block 208, the example method 200 includes forming Isolation features on the substrate. In various embodiments, the Isolation features include one or more separating wall layers formed between adjacent fins and/or STI features formed between fins. Referring to the example of FIG. 3D, in an embodiment of block 208, a plurality of fins 320 (e.g., fins 320*a*, 320*b*, 320*c*, and 320*d*) with interleaved sacrificial epitaxial layers 314 and channel epitaxial layers 316 extend from the substrate 302. A plurality of separating wall layers (e.g., including a separating wall 321 and one or more liners 323) have been formed between fins 320*a* and 320*b*, and between fins 320*c* and 320*d*. Additionally, STI features 322 have been formed between fins 320*b* and 320*c*.

The STI features 322 may include one or more dielectric layers. Suitable dielectric materials for the STI feature 322 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. The deposited dielectric material is subsequently recessed to form the STI features 322. In the illustrated embodiment, the STI features 322 are disposed on sidewalls of the protruding portion of the substrate 302. A top surface of the STI features 322 may be coplanar with a bottom surface of the epitaxial stack 312 or lower than the bottom surface of the epitaxial stack 312 for about 1 nm to about 10 nm. Any suitable etching technique may be used to recess the STI features 322 including dry etching, wet etching, RIE, and/or other etching methods, and in an exemplary embodiment, an anisotropic dry etching is used to selectively remove the dielectric material of the STI features 322 without etching the fins 320.

Figure 4B:
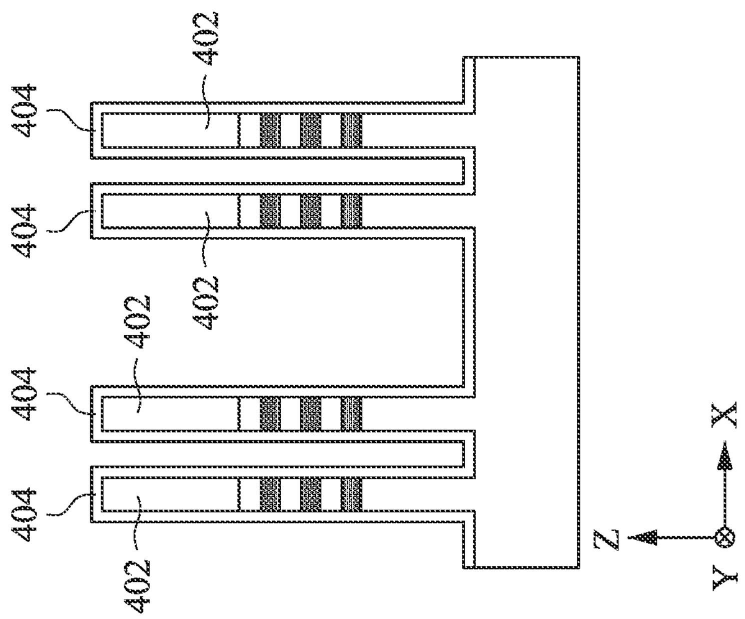
FIGS. 4A-4F are cross-sectional side views of an embodiment of the example semiconductor device at various stages of fabrication in an example fabrication process of forming a separating wall and a plurality of liners, in accordance with some embodiments.
Figure 4A:
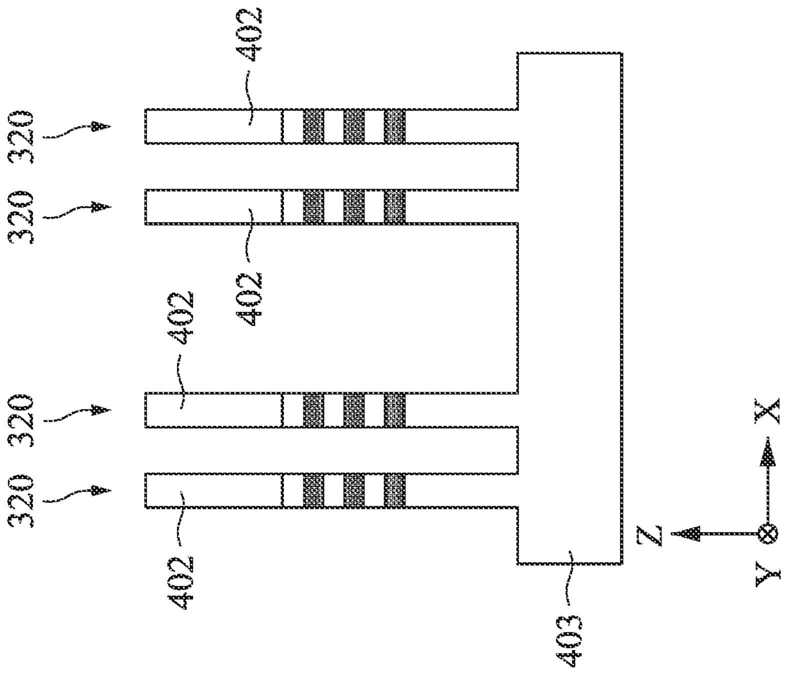
Figure 4C:
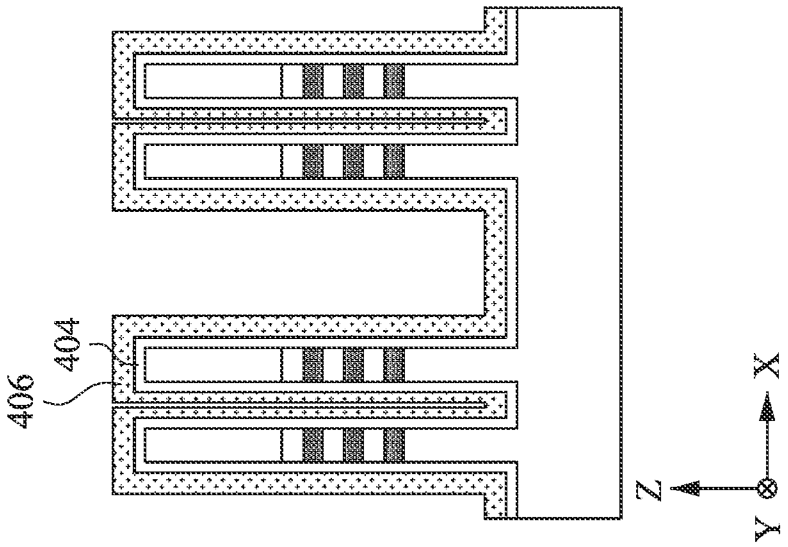
Figure 4D:
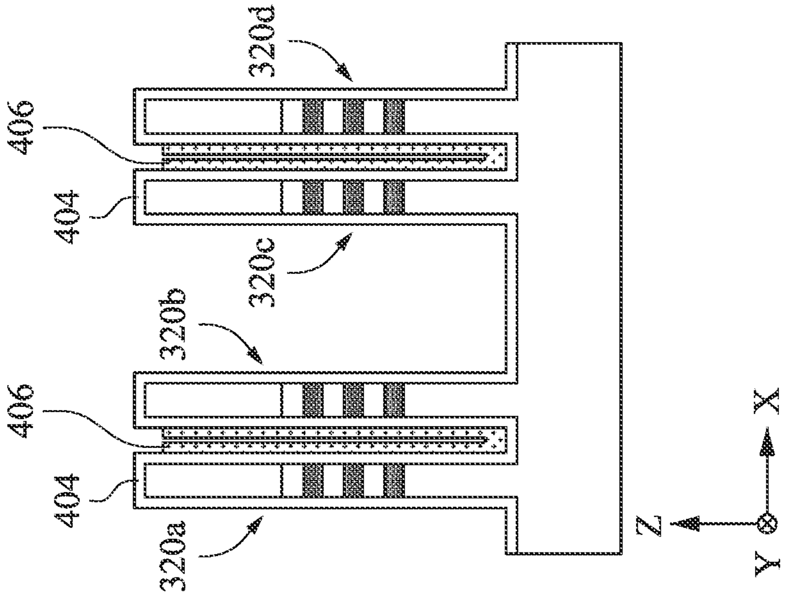

In various embodiments, the separating wall layers include a separating wall 321 and one or more liners 323 formed between the separating wall 321 and the fins 320. The materials of the separation wall 321 can be SiCN, SiOCN and metal oxide, such as $HfO_2$, $ZrO_2$ and $Al_2O_3$, or any suitable dielectric material. FIGS. 4A-4F are cross-sectional side views of an embodiment of the example semiconductor device 300 at various stages of fabrication in an example fabrication process of forming a separating wall and a plurality of liners, in accordance with some embodiments. In the example process of forming a separating wall and a plurality of liners, a hard mask 402 is formed and patterned over the fins 320 as illustrated in the example of FIG. 4A. Liner material 404 for one or more liner(s) are formed over the fins 320, hard mask 402, and substrate 403, as illustrated in the example of FIG. 4B. Wall material 406 is subsequently formed over the liner material 404, as illustrated in the example of FIG. 4C. The wall material 406 is etched leaving wall material 406 between closely adjacent fins 320*a* and 320*b* and between closely adjacent fins 320*c* and 320*d*, as illustrated in the example of FIG. 4D.

Figure 4E:
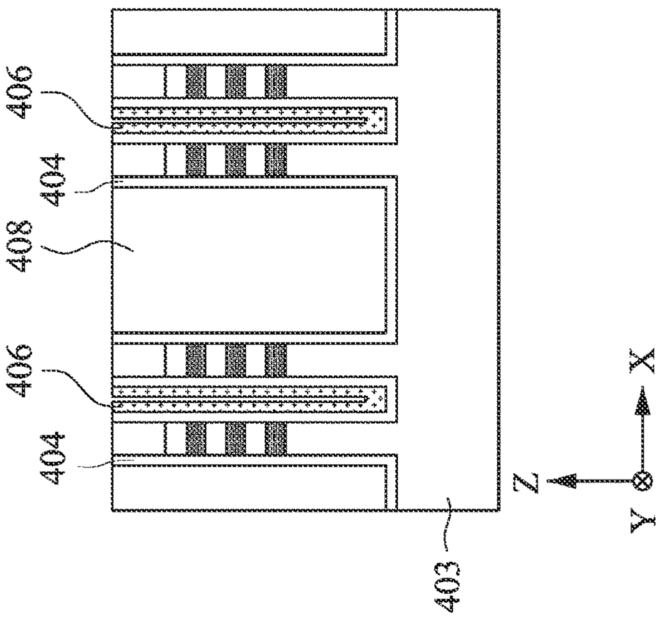
Figure 4F:
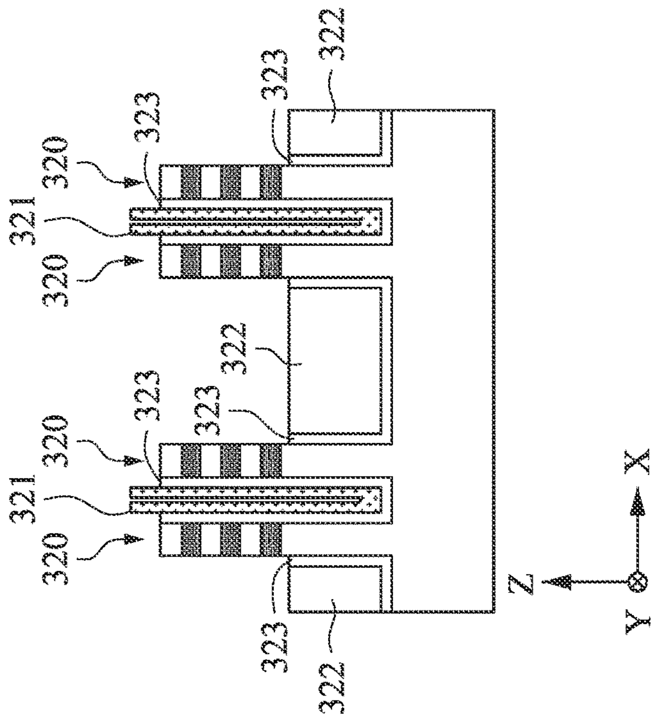

Dielectric material 408 is formed over the substrate 403 including the liner layer(s) and wall material and flattened, for example, using CMP, as illustrated in the example of FIG. 4E. The liner material 404 and the dielectric material 408 are subsequently recessed and the hard mask 402 is removed to form STI features 322 and one or more liners 323 around the fins 320 and a separating wall 321 and one or more liners 323 between closely adjacent fins, as illustrated in the example of FIG. 4F.

At block 210, the example method 200 includes forming a dummy gate structure over channel regions of the fins. In various embodiments, forming a dummy gate structure includes blanket depositing a sacrificial gate dielectric layer, blanket depositing a sacrificial gate electrode layer on the sacrificial gate dielectric layer, and patterning the sacrificial layers/features to form a dummy gate structure on channel regions of the fins. The sacrificial gate electrode layer may include silicon such as polycrystalline silicon or amorphous silicon. The thickness of the sacrificial gate dielectric layer may be in a range from about 1 nm to about 5 nm in some embodiments. The thickness of the sacrificial gate electrode layer may be in a range from about 100 nm to about 200 nm in some embodiments. In some embodiments, the sacrificial gate electrode layer may be subjected to a planarization operation. The sacrificial gate dielectric layer and the sacrificial gate electrode layer may be deposited using CVD, including LPCVD and PECVD, PVD, ALD, or other suitable processes.

The sacrificial layers/features are patterned to form a dummy gate structure on channel regions of the fins. Referring to the example of FIG. 3E, in an embodiment of block 210, a sacrificial gate structure 324 is formed over portions of the fins 320 which is to be channel regions. The sacrificial gate structure 324 defines the channel regions of the GAA devices. The sacrificial gate structure 324 may include a sacrificial gate dielectric layer and a sacrificial gate electrode layer. The sacrificial gate structure 324 may be formed by forming a mask layer over the sacrificial gate electrode layer. The mask layer may include a pad silicon oxide layer and a silicon nitride mask layer. Subsequently, a patterning operation is performed on the mask layer and sacrificial gate dielectric and electrode layers are patterned into the sacrificial gate structure 324. By patterning the sacrificial gate structure 324, the fins 320 are partially exposed on opposite sides of the sacrificial gate structure 324, thereby defining source/drain (S/D) regions.

The sacrificial gate structure 324 is subsequently removed as discussed with reference to block 224 of the method 200 and will be replaced by a final gate stack at a subsequent processing stage of the device 300. In particular, the sacrificial gate structure 324 is replaced at a later processing stage by a high-K dielectric layer (HK) and metal gate electrode (MG) as discussed below.

At block 212, the example method 200 includes forming gate sidewall spacers on sidewalls of the dummy gate stack. Referring to the example of FIG. 3E, in an embodiment of block 212, gate sidewall spacers 332 are formed on sidewalls of the sacrificial gate structure 324. The gate sidewall spacers 332 may include a dielectric material such as silicon oxide, silicon nitride, silicon carbide, silicon oxynitride, SiCN films, silicon oxycarbide, SiOCN films, and/or combinations thereof. In some embodiments, the gate sidewall spacers 332 include multiple layers, such as main spacer walls, liner layers, and the like. By way of example, the gate sidewall spacers 332 may be formed by depositing a dielectric material layer over the sacrificial gate structure 324 using processes such as, a CVD process, a subatmospheric CVD (SACVD) process, a flowable CVD process, an ALD process, a PVD process, or other suitable process. In some embodiments, the deposition of the dielectric material layer is followed by an etching-back (e.g., anisotropically) process to expose portions of the fin 320 adjacent to and not covered by the sacrificial gate structure 324 (e.g., S/D regions). The dielectric material layer may remain on the sidewalls of the sacrificial gate structure 324 as gate sidewall spacers 332. In some embodiments, the etching-back process may include a wet etch process, a dry etch process, a multiple-step etch process, and/or a combination thereof. The gate sidewall spacers 332 may have a thickness ranging from about 5 nm to about 20 nm.

At block 214, the example method includes removing channel and sacrificial layers at the source drain/regions. In various embodiments, the recessing is performed by a suitable etching process, such as a dry etching process, a wet etching process, or an RIE process. Dry etching may be implemented using an etchant including a bromine-containing gas (e.g., HBr and/or CHBR3), a fluorine-containing gas (e.g., CF4, SF6, CH2F2, CHF3, and/or C2F6), other suitable gases, or combinations thereof.

Figure 3F:
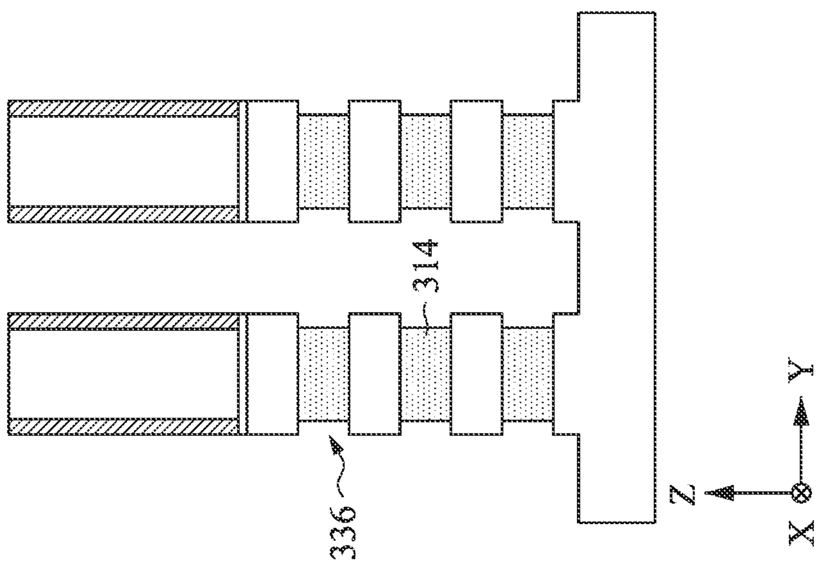
Figure 3E:
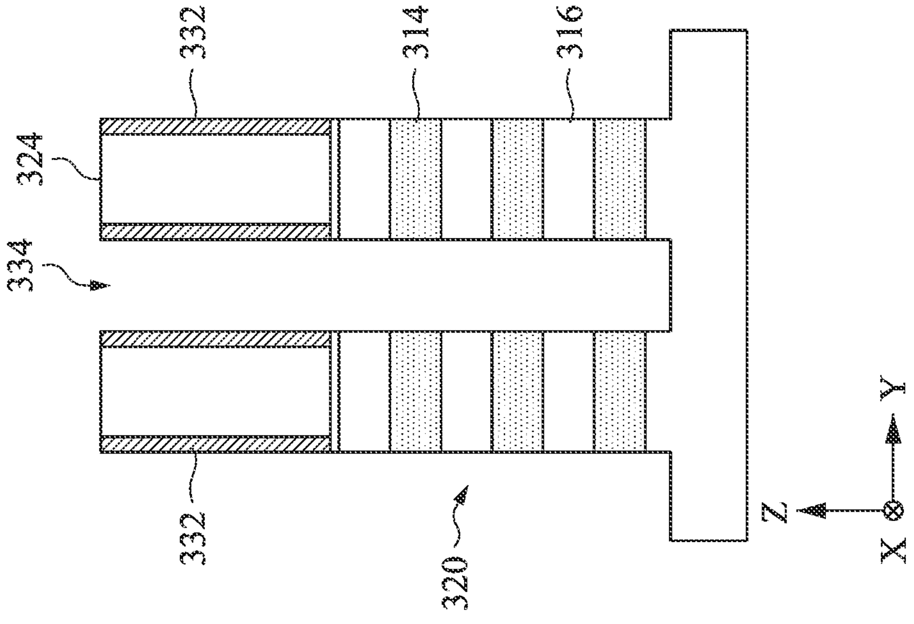
Figure 3H:
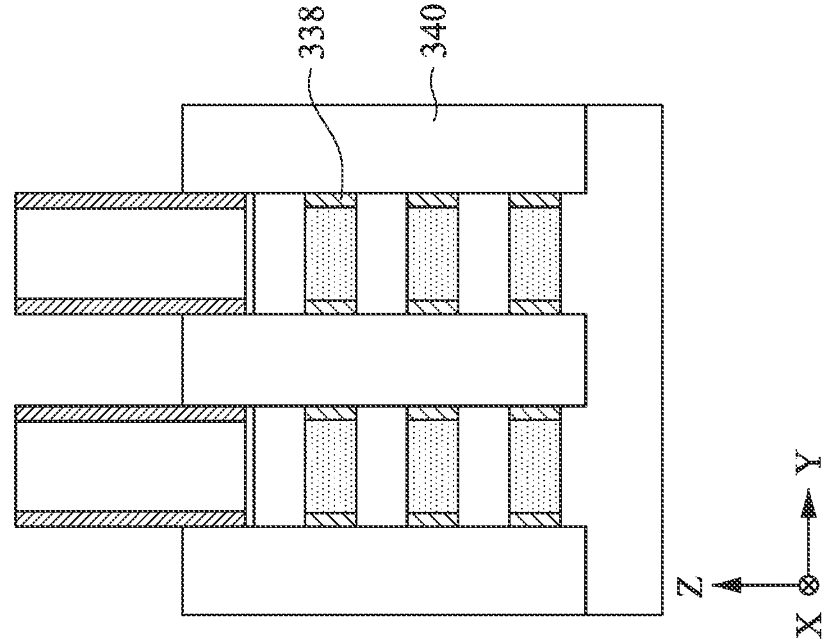

At block 216, the example method 200 Includes recessing sacrificial epitaxial layers. FIG. 3F provides an example embodiment after recessing sacrificial epitaxial layers 314 forming a cavity 336. The sacrificial epitaxial layers 314 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 5A:
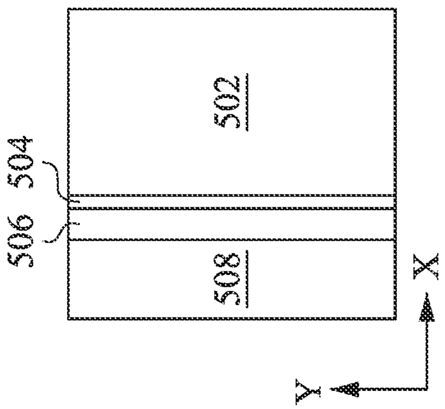
FIGS. 5A-5D are cross-sectional schematic diagrams that illustrates different stages of a fabrication process in which a sacrificial epitaxial layer and liner layers are recessed to achieve leakage prevention, in accordance with some embodiments.
Figure 5B:
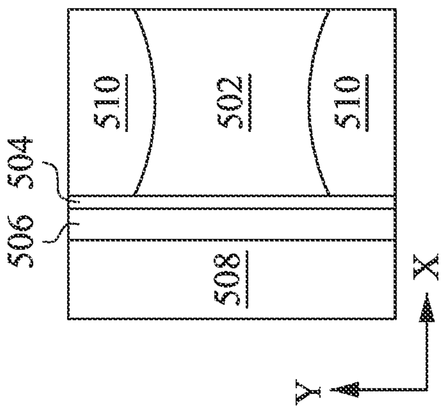
Figure 5C:
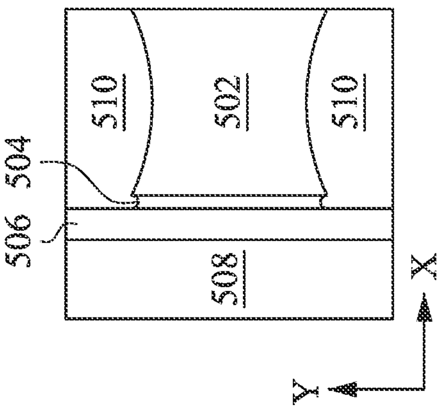
Figure 5D:
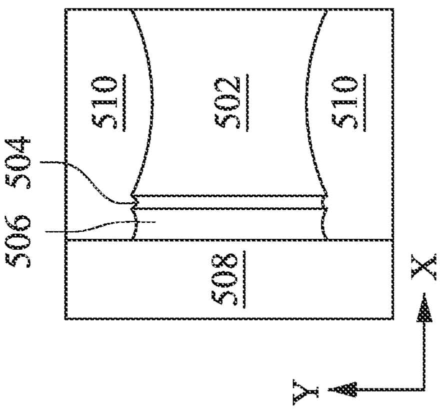

FIGS. 5A-5D are cross-sectional schematic diagrams that illustrates different stages of a fabrication process in which a sacrificial epitaxial layer and liner layers are recessed to achieve leakage prevention. Depicted in FIG. 5A are a sacrificial epitaxial layer 502, a first liner 504, a second liner 506, and a separating wall 508. In other examples, additional liners may be included. At a first step, the sacrificial epitaxial layer 502 may be exposed so that the sacrificial epitaxial layer 502 may be recessed. Depicted in FIG. 5B is the sacrificial epitaxial layer 502 after recessing a cavity 510. At a second step, the first liner 504 is recessed. Depicted in 5C, in an embodiment of the second step, the first liner 504 is recessed which extends the cavity 510. In a third step, the second liner 506 is recessed. Depicted in 5D, in an embodiment of the third step, the second liner 506 is recessed which extends the cavity 510. If additional liners are present, the additional liners are recessed one at a time in sequence beginning with the liner that is closest to the sacrificial epitaxial layer 502 until all of the liners are recessed. After all of the liners are recessed, the example fabrication process in which a sacrificial epitaxial layer and liner layers are recessed to achieve leakage prevention is completed.

Figure 3G:
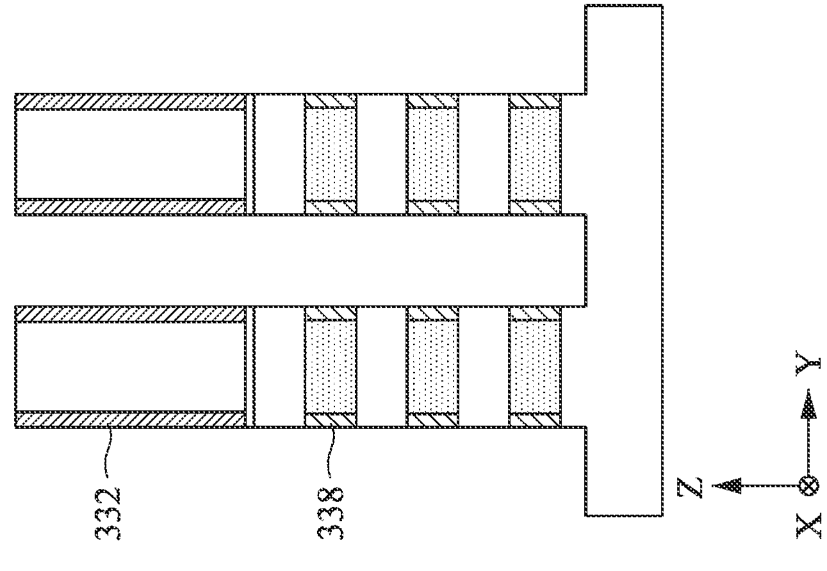
Figure 3J:
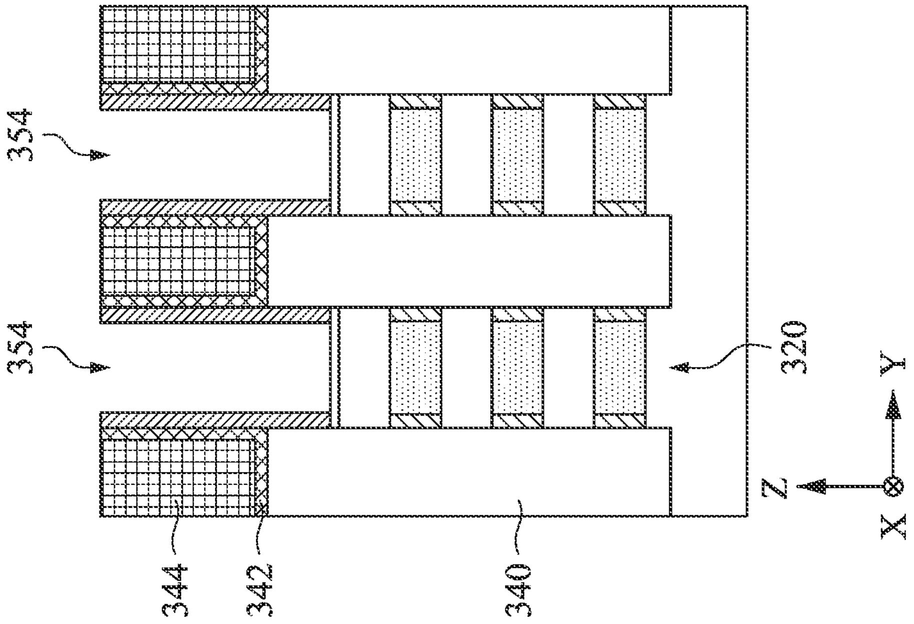
Figure 3I:
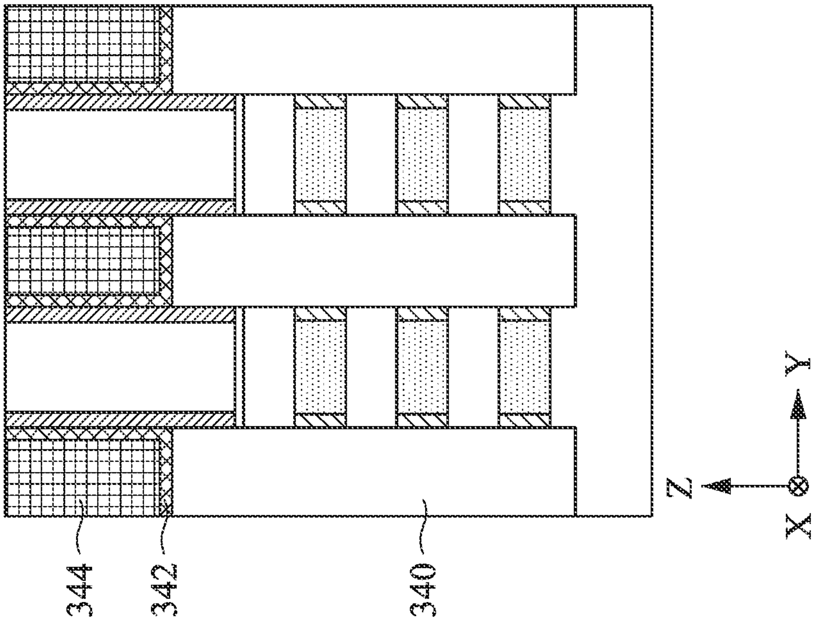
Figure 3L:
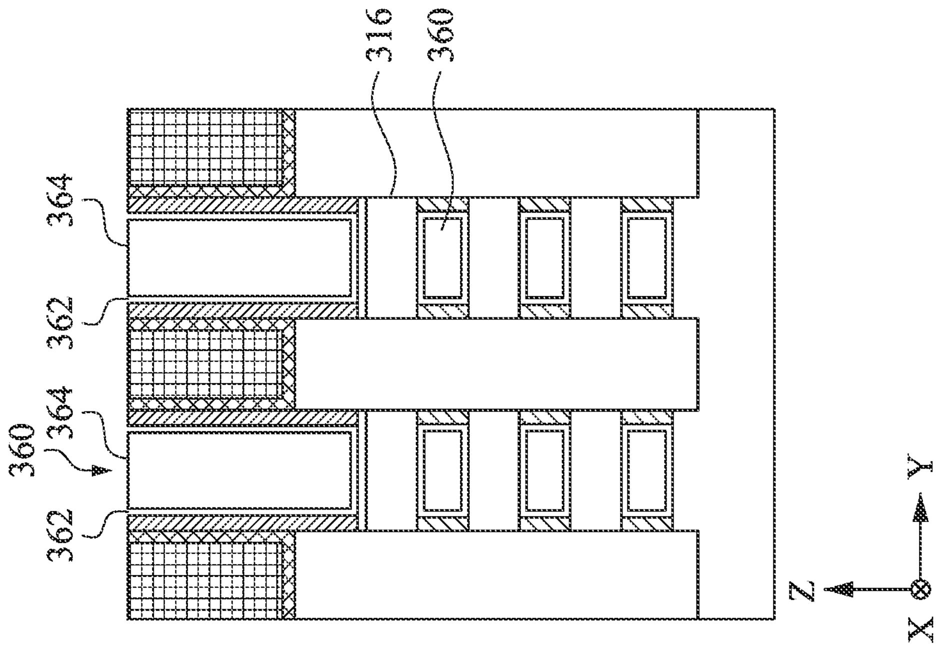
Figure 3K:
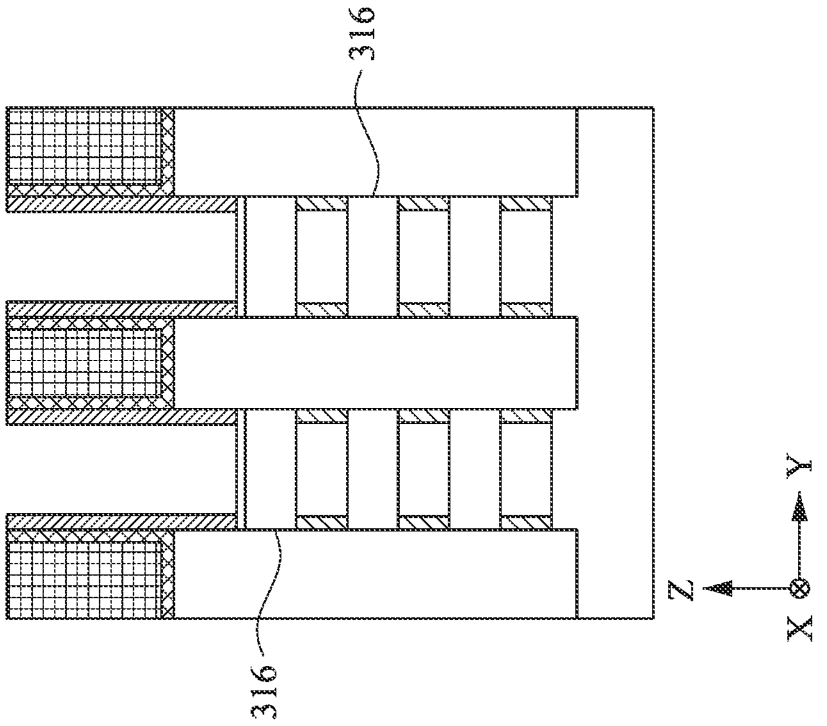

At block 218, the example method 200 Includes forming inner spacers. Forming inner spacers include depositing inner spacer material and etching back inner spacer material. FIG. 3G provides an example embodiment after depositing and etching back the inner spacer material layer 338. An inner spacer material layer 338 is formed on the lateral ends of the sacrificial epitaxial layers 314 in the cavity 336 and on the channel epitaxial layers 316 in the recess 334. The inner spacer material layer 338 may include silicon oxides, silicon nitrides, silicon carbides, silicon carbide nitride, silicon oxide carbide, silicon carbide oxynitride, and/or other suitable dielectric materials. In some embodiments, the inner spacer material layer 338 is deposited as a conformal layer. The inner spacer material layer 338 can be formed by ALD or any other suitable method. By conformally forming the inner spacer material layer 338, the size of the cavity 336 is reduced or completely filled. After the inner spacer material layer 338 is formed, an etching operation is performed to partially remove the inner spacer material layer 338. By this etching, the inner spacer material layer 338 remains substantially within the cavity 336.

At block 220, the example method 200 includes forming source/drain (S/D) features. Referring to the example of FIG. 3H, in an embodiment of block 220. Epitaxial S/D features 340 are formed in recess 334. In some embodiments, the epitaxial S/D features 340 include silicon for NFETs and SiGe for PFETs. In some embodiments, the epitaxial S/D features 340 are formed by an epitaxial growth method using CVD, ALD, or molecular beam epitaxy (MBE). The epitaxial S/D features 340 are formed in contact with the channel epitaxial layers 316 and separated from the sacrificial epitaxial layers 314 by the inner spacers 338.

At block 222, the example method 200 includes forming CESL and ILD layers. Referring to the example of FIG. 3I, in an embodiment of block 222, a contact etch stop layer (CESL) 342 is formed over the epitaxial S/D features 340 and an interlayer dielectric (ILD) layer 344 is formed over the CESL layer 342. The CESL layer 342 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 344 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 344 may be formed by PECVD, flowable CVD (FCVD), or other suitable methods. In some embodiments, forming the ILD layer 344 further includes performing a CMP process to planarize a top surface of the device 300, such that the top surfaces of the sacrificial gate structure 324 are exposed.

At block 224, the example method 200 includes removing the dummy gate stack to form a gate trench. Referring to the example of FIG. 3J, in an embodiment of block 224, the sacrificial gate structure 324 is removed to form a gate trench 354. The gate trench 354 exposes the fin 320 in the channel region(s). The ILD layer 344 and the CESL layer 342 protects the epitaxial S/D features 340 during the removal of the sacrificial gate structure 324. The sacrificial gate structure 324 can be removed using plasma dry etching and/or wet etching. When the sacrificial gate electrode layer is polysilicon and the ILD layer 344 is an oxide, a wet etchant such as a TMAH solution can be used to selectively remove the sacrificial gate electrode layer. The sacrificial gate dielectric layer is thereafter removed using plasma dry etching and/or wet etching.

At block 226, the example method 200 includes removing the sacrificial epitaxial layers to form nanosheets. Referring to the example of FIG. 3K, in an embodiment of block 226, sacrificial epitaxial layers have been removed thereby releasing channel members from the channel region of the GAA device. In the illustrated embodiment, channel members are channel epitaxial layers 316 in the form of nanosheets. In various embodiments, the channel epitaxial layers 316 include silicon, and the sacrificial epitaxial layers 314 include silicon germanium. In various embodiments, the plurality of sacrificial epitaxial layers 314 were selectively removed via a selective removal process that included oxidizing the plurality of sacrificial epitaxial layers 314 using a suitable oxidizer, such as ozone. Thereafter, the oxidized sacrificial epitaxial layers 314 were selectively removed via a dry etching process, for example, by applying an HCl gas at a temperature of about 500 degrees Celsius to about 700 degrees Celsius, or applying a gas mixture of $CF_4$, $SF_6$, and $CHF_3$.

At block 228, the example method 200 includes forming high-K metal gate structures. Referring to the example of FIG. 3L, in an embodiment of block 228, a gate structure 360 is formed. In various embodiments, the gate structure is the gate of a multi-gate transistor. In various embodiments, the gate structure is a high-K metal gate stack, however other compositions are possible. In various embodiments the high-K metal gate stack includes a gate dielectric layer that includes an interfacial layer 362 and a high-k dielectric layer 364. The high-k dielectric layer 364 wraps each of the nanosheets 316, and the interfacial layer 362 is interposed between the high-k dielectric layer and the nanosheets 316. The interfacial layer 362 may include a dielectric material such as silicon oxide ($SiO_2$) or silicon oxynitride (SiON), and may be formed by chemical oxidation, thermal oxidation, atomic layer deposition (ALD), CVD, and/or other suitable methods. The high-k dielectric layer may include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In one embodiment, the gate dielectric layer is formed using a highly conformal deposition process such as ALD to ensure the formation of a gate dielectric layer having a uniform thickness around each channel layers. The high-K metal gate structures may include additional material layers.

At block 230, the example method 200 includes performing further fabrication. A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 6C:
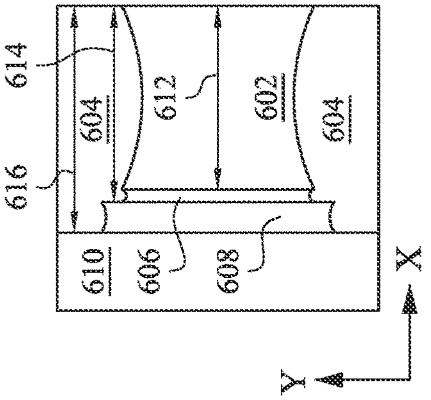
FIGS. 6A-6C are cross-sectional schematic diagrams that illustrates different shapes of material layers around a metal gate layer that may achieve leakage prevention due to the liners (including the first and second liners) being recessed, in accordance with some embodiments.
Figure 6B:
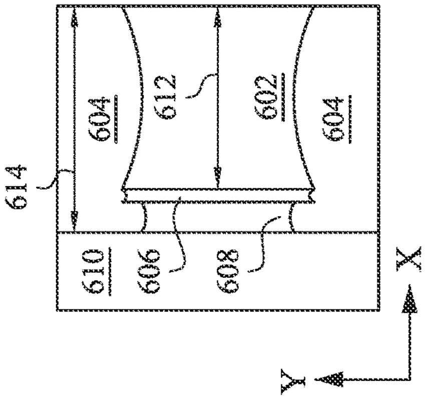
Figure 6A:
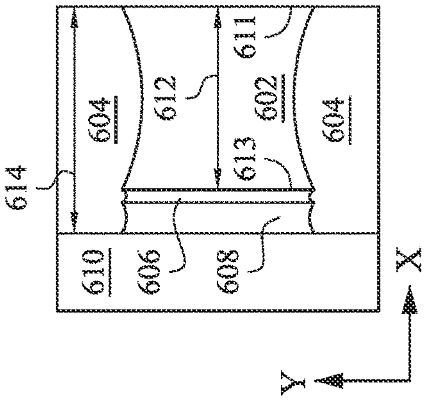

FIGS. 6A-6C are cross-sectional schematic diagrams corresponding to line X2-X2' of FIG. 1B after metal gate formation that illustrates different shapes of material layers around a metal gate layer that may achieve leakage prevention due to the liners (including the first and second liners) being recessed. Depicted are a high-K metal gate (HKMG) layer 602, an inner spacer layer 604, a first liner 606, a second liner 608, and a separating wall 610. In other examples, additional liners may be included. The HKMG layer 602 is bounded by a first end 613 adjacent to the first liner 606 and a second end 611 that is on an opposite side of the HKMG layer 602 from the first end 613. In these examples, the HKMG layer 602 has a first critical dimension (CD), in the y-direction, measured between the inner spacer layer 604, the first liner 606 has a second CD, in the y-direction, measured between the inner spacer layer 604, the second liner 608 has a third CD, in the y-direction, measured between the inner spacer layer 604, and the HKMG layer 602 has a width ($W_{HKMG}$) 612 measured from the first end 613 to the second end 611 adjacent to the first liner 606.

In the example of FIG. 6A, the first CD of the HKMG layer 602, the second CD of the first liner 606, and the third CD of the second liner 608 are approximately equal. In the example of FIG. 6B, the first CD of the HKMG layer 602 and the second CD of the first liner 606 are approximately equal, but the third CD of the second liner 608 is smaller than the first CD and the second CD. In the example of FIG. 6C, the first CD of the HKMG layer 602 and the second CD of the first liner 606 are approximately equal, but the third CD of the second liner 608 is larger than the first CD and the second CD.

In the examples of FIGS. 6A and 6B a single inner spacer width ($W_{IS1}$) 614 is defined, which is defined as the width of the HKMG layer 602 plus the width of the liner closest to the HKMG layer 602 that has a CD that is substantially greater than the CD of the HKMG layer 602. Because the CDs of liner 1 and liner 2 are less than or equal to the CD of the HKMG layer 602, the inner spacer width ($W_{IS1}$) 614 extends to the separating wall 610.

In the example of FIG. 6C, a first inner spacer width ($W_{IS1}$) 614 is defined, which is defined as the width of the HKMG layer 602 plus the width of the liner closest to the HKMG layer 602 that has a CD that is substantially greater than the CD of the HKMG layer 602, and a second inner spacer width ($W_{IS2}$) 616 is defined, which is defined as the width of the HKMG layer 602 plus the width of the second liner closest to the HKMG layer 602 that has a CD that is substantially greater than the CD of the HKMG layer 602. Because the CD of liner 1 is less than or equal to the CD of the HKMG layer 602, and the CD of the second liner 608 is greater than the CD of the HKMG layer 602, the inner spacer width ($W_{IS1}$) 614 extends to the second liner 608. The second inner spacer width ($W_{IS2}$) 616 extends to the separating wall 610 because there are no other inner spacers with a CD greater than the CD of the HKMG layer 602. If additional inner spacers existed, additional inner spacer widths (e.g., $W_{IS1}$, $W_{IS2}$, . . . . $W_{ISn}$, n≤10) may possibly exist.

In each of the scenarios depicted in in FIGS. 6A-6C, leakage prevention is achieved when the inner spacer layer 604 has a first inner spacer width ($W_{IS1}$) 614 that is more than 3 Angstroms greater than the width ($W_{HKMG}$) 612 of the HKMG layer 602. Stated another way, leakage prevention is achieved when $W_{IS1}-W_{HKMG}>3$ A. In these examples, the first inner spacer width ($W_{IS1}$) 614 is measured to a structure having a CD substantially greater than (e.g., 3 Angstroms greater than) the CD of the HKMG layer 602.

Figure 7C:
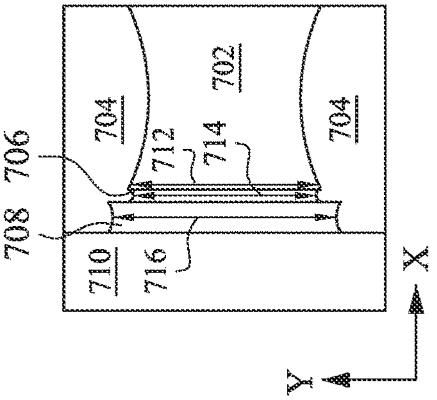
FIGS. 7A-7C are cross-sectional schematic diagrams that illustrates different shapes of material layers around a metal gate layer that may achieve leakage prevention due to the liners (including the first and second liners) being recessed, in accordance with some embodiments.
Figure 7B:
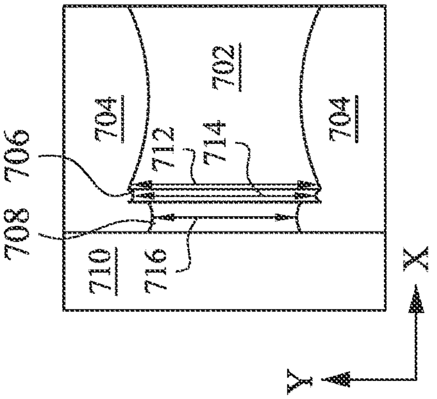
Figure 7A:
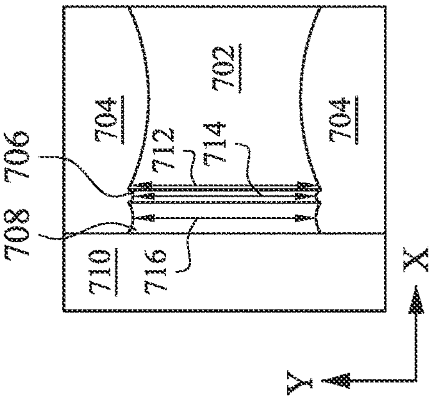

FIGS. 7A-7C are cross-sectional schematic diagrams corresponding to line X2-X2' of FIG. 1B after metal gate formation that illustrates different shapes of material layers around a metal gate layer that may achieve leakage prevention due to the liners (including the first and second liners) being recessed. Depicted are an HKMG layer 702, an inner spacer layer 704, a first liner 706, a second liner 708, and a separating wall 710. In other examples, additional liners may be included. In these examples, the HKMG layer 702 has a first critical dimension (CD) 712 measured between the inner spacer layer 704 at an end closest to the first liner 706, the first liner 706 has a second CD 714 measured between the inner spacer layer 704, and the second liner 708 has a third CD 716 measured between the inner spacer layer 704. The different shapes shown in FIGS. 7A-7C may exist due to different etch behavior in different layout designs.

In the example of FIG. 7A, the first CD 712, the second CD 714, and the third CD 716 are approximately equal. In the example of FIG. 7B, the first CD 712 and the second CD 714 are approximately equal, but the third CD 716 is smaller than the first CD 712 and the second CD 714. In the example of FIG. 7C, the first CD 712 and the second CD 714 are approximately equal, but the third CD 716 is larger than the first CD 712 and the second CD 714. In these examples, leakage prevention may be achieved when the absolute value of the difference between the first CD 712 and the second CD 714 is less than or equal to 5 Angstroms (5 A≥|first CD 712−second CD 714|). Leakage prevention may also be achieved when the first CD 712 minus the second CD 714 is greater than 3 Angstroms (first CD 712−second CD 714>3 A). Also, leakage prevention may be achieved when the first CD 712>the second CD 714.

In the examples of FIG. 7A, leakage prevention may be achieved when the difference between the first CD 712 and the second CD 714 is less than or equal to 5 Angstroms (5 A≥|first CD 712−second CD 714|) and when the difference between the second CD 714 and the third CD 716 is less than or equal to 5 Angstroms (5 A≥|second CD 714−third CD 716|). Also, leakage prevention may be achieved when the difference between the first CD 712 and the third CD 716 is less than or equal to 5 Angstroms (5 A≥|first CD 712−third CD 716|).

In the examples of FIG. 7B, leakage prevention may be achieved when the difference between the first CD 712 and the second CD 714 is less than or equal to 5 Angstroms (5 A≥|first CD 712−second CD 714|) and when the second CD 714 minus the third CD 716 is greater than or equal to 3 Angstroms (second CD 714−third CD 716≥3 A). Also, leakage prevention may be achieved when the first CD 712 minus the third CD 716 is greater than or equal to 3 Angstroms (first CD 712−third CD 716≥3 A).

In the example of FIG. 7C, leakage prevention may be achieved when the difference between the first CD 712 and the second CD 714 is less than or equal to 5 Angstroms (5 A≥|first CD 712−second CD 714|) and when the third CD 716 minus the second CD 714 is greater than or equal to 3 Angstroms (third CD 716−second CD 714≥3 A). Also, leakage prevention may be achieved when the third CD 716 minus the first CD 712 is greater than or equal to 3 Angstroms (third CD 716−first CD 712≥3 A).

Figure 8B:
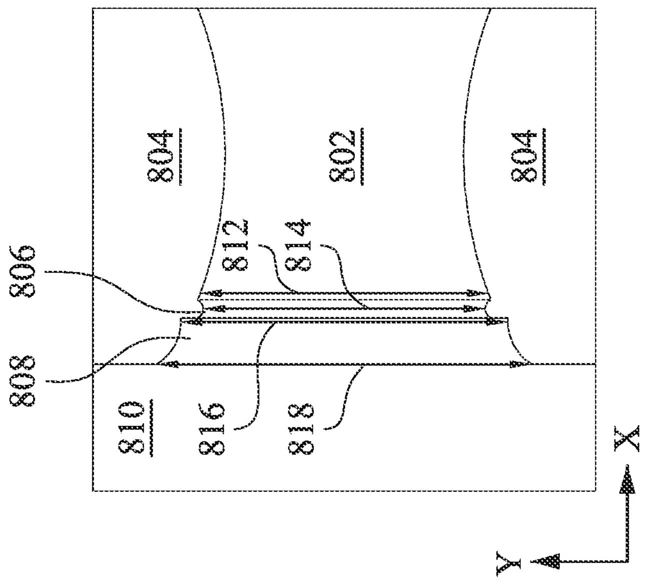
FIGS. 8A-8B are cross-sectional schematic diagrams that illustrates different shapes of material layers around a metal gate layer that may achieve leakage prevention due to the liners (including the first and second liners) being recessed, in accordance with some embodiments.
Figure 8A:
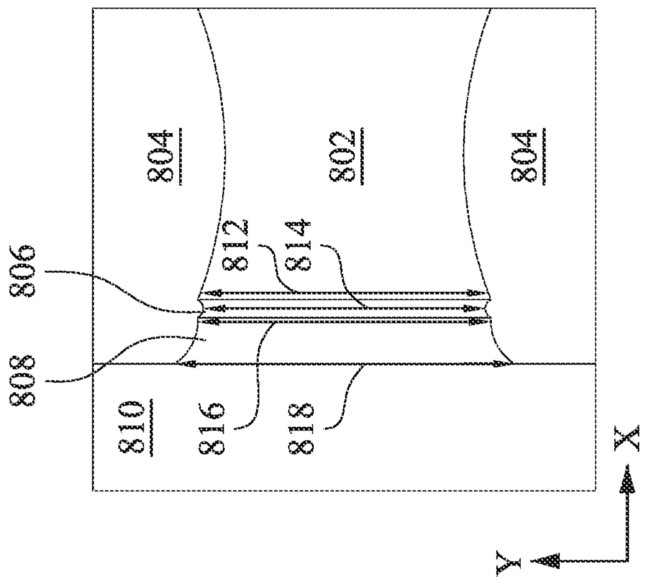

FIGS. 8A-8B are cross-sectional schematic diagrams corresponding to line X2-X2' of FIG. 1B after metal gate formation that illustrates different shapes of material layers around a metal gate layer that may achieve leakage prevention due to the liners (including the first and second liners) being recessed. Depicted are an HKMG layer 802, an inner spacer layer 804, a first liner 806, a second liner 808, and a separating wall 810. In other examples, additional liners may be included. In these examples, the HKMG layer 802 has a first critical dimension (CD) 812 measured between the inner spacer layer 804 at an end closest to the first liner 806, the first liner 806 has a second CD 814 measured between the inner spacer layer 704, and the second liner 808 has a third CD 816 and a fourth CD 818. The third CD 816 is on an end of the second liner 808 that is closest to the first liner 806, and the fourth CD 818 is on an end of the second liner 808 that is closest to the separating wall 810. The asymmetric shapes for the second liner 808 shown in FIGS. 8A-8B may exist due to different etch behavior in different layout designs. The asymmetric shape in the second liner 808 may be caused by a lower etch rate due to less reaction area for the etching process.

In the example of FIG. 8A, the first CD 812, the second CD 814, and the third CD 816 are approximately equal, but the fourth CD 818 is larger. In the example of FIG. 8B, the first CD 812 and the second CD 814 are approximately equal, but the third CD 816 and the fourth CD 818 are larger than the first CD 812 and the second CD 814. In these examples, the third CD 816 is larger than the fourth CD 818. In various embodiments, the third CD 816 is more than 3 Angstroms are larger than the fourth CD 818.

In the examples of FIG. 8A, leakage prevention may be achieved when the difference between the first CD 812 and the third CD 816 is less than or equal to 5 Angstroms (5 A≥|first CD 712−third CD 716|) and when the fourth CD 818 minus the first CD 812 is greater than or equal to 3 Angstroms (fourth CD 818−first CD 812≥3 A).

In the examples of FIG. 8B, leakage prevention may be achieved when the third CD 816 minus the first CD 812 is greater than or equal to 3 Angstroms (third CD 816−first CD 812≥3 A) and when the fourth CD 818 minus the first CD 812 is greater than or equal to 3 Angstroms (fourth CD 818−first CD 812≥3 A).

Improved systems, fabrication methods, fabrication techniques, and articles have been described. The described systems, methods, techniques, and articles can be used with a wide range of semiconductor devices including Gate-all-around FET (GAAFET/NSFET). The described systems, methods, techniques, and articles can be used in the manufacture of semiconductor devices including semiconductor devices with a nanosheet structure. The described systems, methods, techniques, and articles can be used to prevent current leakage from a metal gate to a source/drain region via a liner.

In some aspects, the techniques described herein relate to a fabrication method, including: providing an separating wall and a plurality of liners including a first liner and a second liner between a first fin and a second fin having an epitaxial stack and a sacrificial gate stack over channel regions of the second fin, wherein the first liner is closer to the epitaxial stack and the second liner is closer to the separating wall; recessing a sacrificial epitaxial layer of the epitaxial stack to form a cavity; recessing the first liner, after recessing sacrificial epitaxial layer, thereby expanding the cavity; recessing the second liner, after recessing the first liner, thereby expanding the cavity; forming inner spacer material in the cavity; forming source/drain features; and replacing the sacrificial epitaxial layer and the sacrificial gate stack with a metal gate layer; wherein the metal gate layer has a first critical dimension (CD) measured between the inner spacer material, and wherein the first liner after recessing has a second CD measured between the inner spacer material.

In some aspects, the techniques described herein relate to a method, wherein an absolute value of a difference between the first CD and the second CD is less than 5 Angstroms (5 A).

In some aspects, the techniques described herein relate to a method, wherein: the metal gate layer has a first width measured from a first end adjacent to the first liner to a second end that is on an opposite side of the metal gate layer from the first end; and the inner spacer material has a second width, measured from a line extending along the second end to a structure, that is 3 Angstroms (3 A) greater than the first width, wherein the structure has a CD greater than or equal to the first CD plus 3 A.

In some aspects, the techniques described herein relate to a method, wherein the structure is the second liner.

In some aspects, the techniques described herein relate to a method, wherein the structure is the separating wall.

In some aspects, the techniques described herein relate to a method, wherein the second liner after recessing has a third CD measured between the inner spacer material, and an absolute value of a difference between the second CD and the third CD is less than or equal to 5 Angstroms (5 A).

In some aspects, the techniques described herein relate to a method, wherein the second liner after recessing has a third CD measured between the inner spacer material, and the third CD minus the second CD is greater than or equal to 3 Angstroms (3 A).

In some aspects, the techniques described herein relate to a method, wherein the second liner after recessing has a third CD measured between the inner spacer material, and the second CD minus the third CD is greater than or equal to three Angstroms (A).

In some aspects, the techniques described herein relate to a method, wherein: the second liner has an asymmetric liner shape; the second liner has a third CD measured between the inner spacer material that is measured at an end closest to the first liner; the second liner has a fourth CD measured at an end closest to the separating wall; an absolute value of a difference between the first CD and the third CD is less than or equal to 5 A; and the fourth CD minus the first CD is greater than or equal to 3 A.

In some aspects, the techniques described herein relate to a method, wherein: the second liner has an asymmetric liner shape; the second liner has a third CD measured between the inner spacer material that is measured at an end closest to the first liner; the second liner has a fourth CD measured at an end closest to the separating wall; the third CD minus the first CD is greater than or equal to 3 A; and the fourth CD minus the first CD is greater than or equal to 3 A.

In some aspects, the techniques described herein relate to a semiconductor device, including: a first fin and a second fin, the first fin having a channel region including at plurality of channel sheet layers and a plurality of metal gate layers; an separating wall and a plurality of liners including a first liner and a second liner formed between the first fin and the second fin, wherein the first liner is closer to at least one metal gate layer of the plurality of metal gate layers and the second liner is closer to the separating wall; and inner spacer material formed around the at least one metal gate layer, the first liner, and the second liner; wherein the at least one metal gate layer has a first critical dimension (CD) measured between the inner spacer material at an end closest to a first liner, and the first liner has a second CD measured between the inner spacer material that is approximately equal to the first CD.

In some aspects, the techniques described herein relate to a semiconductor device, wherein an absolute value of a difference between the first CD and the second CD is less than 5 Angstroms (5 A).

In some aspects, the techniques described herein relate to a semiconductor device, wherein: the at least one metal gate layer has a first width measured from a first end to a second end adjacent to the first liner; and the inner spacer material has a second width, measured from the first end to a structure having a CD greater than or equal to the first CD plus 3 A, that is 3 A greater than the first width.

In some aspects, the techniques described herein relate to a semiconductor device, wherein the structure is the second liner.

In some aspects, the techniques described herein relate to a semiconductor device, wherein the structure is the separating wall.

In some aspects, the techniques described herein relate to a semiconductor device, wherein the second liner has a third CD measured between the inner spacer material, and an absolute value of a difference between the second CD and the third CD is less than or equal to five Angstroms (A).

In some aspects, the techniques described herein relate to a semiconductor device, wherein the second liner has a third CD measured between the inner spacer material, and the third CD minus the second CD is greater than or equal to three Angstroms (A).

In some aspects, the techniques described herein relate to a semiconductor device, wherein the second liner has a third CD measured between the inner spacer material, and the second CD minus the third CD is greater than or equal to three Angstroms (A).

In some aspects, the techniques described herein relate to a semiconductor device, wherein: the second liner has an asymmetric liner shape; the second liner has a third CD measured between the inner spacer material that is measured at an end closest to the first liner; the second liner has a fourth CD measured at an end closest to the separating wall; an absolute value of a difference between the first CD and the third CD is less than or equal to 5 A; and the fourth CD minus the first CD is greater than or equal to 3 A.

In some aspects, the techniques described herein relate to a semiconductor device, wherein: the second liner has an asymmetric liner shape; the second liner has a third CD measured between the inner spacer material that is measured at an end closest to the first liner; the second liner has a fourth CD measured at an end closest to the separating wall; the third CD minus the first CD is greater than or equal to 3 A; and the fourth CD minus the first CD is greater than or equal to 3 A.

In some aspects, the techniques described herein relate to a fabrication method, including: forming a first fin and a second fin, the first fin having an epitaxial stack including at least one sacrificial epitaxial layer and at least one channel epitaxial layer; forming an separating wall and a plurality of liners including a first liner and a second liner between the first fin and the second fin, wherein the first liner is closer to the at least one sacrificial epitaxial layer of the first fin and the second liner is closer to the separating wall; forming a sacrificial gate stack over channel regions of the first fin; recessing the at least one sacrificial epitaxial layer to form a cavity; recessing the first liner, after recessing the at least one sacrificial epitaxial layer, thereby expanding the cavity; recessing the second liner, after recessing the first liner, thereby expanding the cavity; forming inner spacer material in the cavity; forming source/drain features; and replacing the sacrificial gate stack and the at least one sacrificial epitaxial layer with a metal gate; wherein the metal gate has a first critical dimension (CD) measured between the inner spacer material, the first liner has a second CD measured between the inner spacer material, and the second liner has a third CD measured between the inner spacer material.

In some aspects, the techniques described herein relate to a method, wherein an absolute value of a difference between the first CD and the second CD is less than 5 Angstroms (5 A).

In some aspects, the techniques described herein relate to a method, wherein: the metal gate has a first width measured from a first end to a second end adjacent to the first liner; and the inner spacer material has a second width, measured from the first end to a structure having a CD greater than or equal to the first CD plus 3 Angstroms (3 A), that is 3 A greater than the first width.

In some aspects, the techniques described herein relate to a method, wherein the structure is the second liner.

In some aspects, the techniques described herein relate to a method, wherein the structure is the separating wall.

In some aspects, the techniques described herein relate to a method, wherein the second liner after recessing has a third CD measured between the inner spacer material, and an absolute value of a difference between the second CD and the third CD is less than or equal to 5 Angstroms (5 A).

In some aspects, the techniques described herein relate to a method, wherein the second liner after recessing has a third CD measured between the inner spacer material, and the third CD minus the second CD is greater than or equal to 3 Angstroms (3 A).

In some aspects, the techniques described herein relate to a method, wherein the second liner after recessing has a third CD measured between the inner spacer material, and the second CD minus the third CD is greater than or equal to three Angstroms (A).

In some aspects, the techniques described herein relate to a method, wherein: the second liner has an asymmetric liner shape; the second liner has a third CD measured between the inner spacer material that is measured at an end closest to the first liner; the second liner has a fourth CD measured at an end closest to the separating wall; an absolute value of a difference between the first CD and the third CD is less than or equal to 5 A; and the fourth CD minus the first CD is greater than or equal to 3 A.

In some aspects, the techniques described herein relate to a method, wherein: the second liner has an asymmetric liner shape; the second liner has a third CD measured between the inner spacer material that is measured at an end closest to the first liner; the second liner has a fourth CD measured at an end closest to the separating wall; the third CD minus the first CD is greater than or equal to 3 A; and the fourth CD minus the first CD is greater than or equal to 3 A.

In some aspects, the techniques described herein relate to a fabrication method, including: forming a first fin and a second fin, the first fin having an epitaxial stack including at least one sacrificial epitaxial layer and at least one channel epitaxial layer; forming an separating wall and a plurality of liners including a first liner and a second liner between the first fin and the second fin, wherein the first liner is closer to the at least one sacrificial epitaxial layer of the first fin and the second liner is closer to the separating wall; forming a first sacrificial gate stack over channel regions of the first fin; recessing the at least one sacrificial epitaxial layer to form a first cavity and a second cavity, the at least one sacrificial layer after recessing having a first critical dimension (CD) measured between the first cavity and the second cavity at an end closest to the first liner; recessing the first liner to expand the first cavity and the second cavity, the first liner after recessing having a second CD measured between the first cavity and the second cavity, wherein an absolute value of a difference between the first CD and the second CD is less than five Angstroms (A); recessing the second liner, after recessing the first liner, to expand the first cavity and the second cavity, the second liner after recessing having a third CD measured between the first cavity and the second cavity; forming inner spacer material in the first and second cavities; forming source/drain features; removing the sacrificial gate stack and the at least one sacrificial epitaxial layer in the fin; and forming a metal gate to replace the sacrificial gate stack and the at least one sacrificial epitaxial layer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A fabrication method, comprising:

providing a separating wall and a plurality of liners including a first liner and a second liner between a first fin and a second fin having an epitaxial stack and a sacrificial gate stack over channel regions of the second fin, wherein the first liner is closer to the epitaxial stack and the second liner is closer to the separating wall;

recessing a sacrificial epitaxial layer of the epitaxial stack to form a cavity;

recessing the first liner, after recessing sacrificial epitaxial layer, thereby expanding the cavity;

recessing the second liner, after recessing the first liner, thereby expanding the cavity;

forming inner spacer material in the cavity;

forming source/drain features; and replacing the sacrificial epitaxial layer and the sacrificial gate stack with a metal gate layer;

wherein the metal gate layer has a first critical dimension (CD) measured between the inner spacer material, and wherein the first liner after recessing has a second CD measured between the inner spacer material.

2. The method of claim 1, wherein an absolute value of a difference between the first CD and the second CD is less than 5 Angstroms (5 A).

3. The method of claim 2, wherein:

the metal gate layer has a first width measured from a first end adjacent to the first liner to a second end that is on an opposite side of the metal gate layer from the first end; and the inner spacer material has a second width, measured from a line extending along the second end to a structure, that is 3 Angstroms (3 A) greater than the first width, wherein the structure has a CD greater than or equal to the first CD plus 3 A.

4. The method of claim 3, wherein the structure is the second liner.

5. The method of claim 3, wherein the structure is the separating wall.

6. The method of claim 1, wherein the second liner after recessing has a third CD measured between the inner spacer material, and an absolute value of a difference between the second CD and the third CD is less than or equal to 5 Angstroms (5 A).

7. The method of claim 1, wherein the second liner after recessing has a third CD measured between the inner spacer material, and the third CD minus the second CD is greater than or equal to 3 Angstroms (3 A).

8. The method of claim 1, wherein the second liner after recessing has a third CD measured between the inner spacer material, and the second CD minus the third CD is greater than or equal to three Angstroms (A).

9. A fabrication method, comprising:

forming a first fin and a second fin, the first fin having an epitaxial stack comprising at least one sacrificial epitaxial layer and at least one channel epitaxial layer;

forming a separating wall and a plurality of liners including a first liner and a second liner between the first fin and the second fin, wherein the first liner is closer to the at least one sacrificial epitaxial layer of the first fin and the second liner is closer to the separating wall;

forming a sacrificial gate stack over channel regions of the first fin;

recessing the at least one sacrificial epitaxial layer to form a cavity;

recessing the first liner, after recessing the at least one sacrificial epitaxial layer, thereby expanding the cavity;

recessing the second liner, after recessing the first liner, thereby expanding the cavity;

forming inner spacer material in the cavity;

forming source/drain features; and replacing the sacrificial gate stack and the at least one sacrificial epitaxial layer with a metal gate;

wherein the metal gate has a first critical dimension (CD) measured between the inner spacer material, the first liner has a second CD measured between the inner spacer material, and the second liner has a third CD measured between the inner spacer material.

10. The method of claim 9, wherein the second liner after recessing has a third CD measured between the inner spacer material, and an absolute value of a difference between the second CD and the third CD is less than or equal to 5 Angstroms (5 A).

11. The method of claim 9, wherein the second liner after recessing has a third CD measured between the inner spacer material, and the third CD minus the second CD is greater than or equal to 3 Angstroms (3 A).

12. The method of claim 9, wherein the second liner after recessing has a third CD measured between the inner spacer material, and the second CD minus the third CD is greater than or equal to three Angstroms (A).

13. The method of claim 9, wherein:

the second liner has an asymmetric liner shape;

the second liner has a third CD measured between the inner spacer material that is measured at an end closest to the first liner;

the second liner has a fourth CD measured at an end closest to the separating wall;

an absolute value of a difference between the first CD and the third CD is less than or equal to 5 A; and the fourth CD minus the first CD is greater than or equal to 3 A.

14. The method of claim 9, wherein:

the second liner has an asymmetric liner shape;

the second liner has a third CD measured between the inner spacer material that is measured at an end closest to the first liner;

the second liner has a fourth CD measured at an end closest to the separating wall;

the third CD minus the first CD is greater than or equal to 3 A; and the fourth CD minus the first CD is greater than or equal to 3 A.

15. A method, comprising:

forming a first fin and a second fin, the first fin having a channel region comprising at plurality of channel sheet layers and a plurality of metal gate layers;

forming a separating wall and a plurality of liners including a first liner and a second liner between the first fin and the second fin, wherein the first liner is closer to at least one metal gate layer of the plurality of metal gate layers and the second liner is closer to the separating wall; and forming inner spacer material around the at least one metal gate layer, the first liner, and the second liner;

wherein the at least one metal gate layer has a first critical dimension (CD) measured between the inner spacer material at an end closest to a first liner, and the first liner has a second CD measured between the inner spacer material that is approximately equal to the first CD.

16. The method of claim 15, wherein the second liner has a third CD measured between the inner spacer material, and an absolute value of a difference between the second CD and the third CD is less than or equal to five Angstroms (A).

17. The method of claim 15, wherein the second liner has a third CD measured between the inner spacer material, and the third CD minus the second CD is greater than or equal to three Angstroms (A).

18. The method of claim 15, wherein the second liner has a third CD measured between the inner spacer material, and the second CD minus the third CD is greater than or equal to three Angstroms (A).

19. The method of claim 15, wherein:

the second liner has an asymmetric liner shape;

the second liner has a third CD measured between the inner spacer material that is measured at an end closest to the first liner;

the second liner has a fourth CD measured at an end closest to the separating wall;

an absolute value of a difference between the first CD and the third CD is less than or equal to 5 A; and the fourth CD minus the first CD is greater than or equal to 3 A.

20. The method of claim 15, wherein:

the second liner has an asymmetric liner shape;

the second liner has a third CD measured between the inner spacer material that is measured at an end closest to the first liner;

the second liner has a fourth CD measured at an end closest to the separating wall;

the third CD minus the first CD is greater than or equal to 3 A; and the fourth CD minus the first CD is greater than or equal to 3 A.

* * * * *